United States Patent
Van Zijl et al.

(10) Patent No.: US 8,536,866 B2
(45) Date of Patent: Sep. 17, 2013

(54) FREQUENCY REFERENCING FOR CHEMICAL EXCHANGE SATURATION TRANSFER (CEST) MRI

(75) Inventors: Peter C. Van Zijl, Ellicott City, MD (US); Joseph S. Gillen, Monkton, MD (US); Mina Kim, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 625 days.

(21) Appl. No.: 12/679,921

(22) PCT Filed: Sep. 26, 2008

(86) PCT No.: PCT/US2008/077885
§ 371 (c)(1),
(2), (4) Date: Mar. 25, 2010

(87) PCT Pub. No.: WO2009/042881
PCT Pub. Date: Apr. 2, 2009

(65) Prior Publication Data
US 2010/0286502 A1    Nov. 11, 2010

Related U.S. Application Data

(60) Provisional application No. 60/995,377, filed on Sep. 26, 2007.

(51) Int. Cl.
*G01V 3/00* (2006.01)
(52) U.S. Cl.
USPC .......................................... 324/309; 324/307
(58) Field of Classification Search
USPC ...................... 324/300–322; 600/407–445
See application file for complete search history.

(56) References Cited

U.S. PATENT DOCUMENTS

| | | | | |
|---|---|---|---|---|
| 6,943,033 | B2 * | 9/2005 | Van Zijl et al. | 436/173 |
| 7,683,617 | B2 * | 3/2010 | Van Zijl et al. | 324/309 |
| 7,894,875 | B2 * | 2/2011 | Van Zijl et al. | 600/419 |
| 2002/0127182 | A1 | 9/2002 | Sherry et al. | |
| 2004/0030239 | A1 * | 2/2004 | Van Zijl et al. | 600/420 |

(Continued)

FOREIGN PATENT DOCUMENTS

| | | |
|---|---|---|
| EP | 1331012 A1 | 7/2003 |
| WO | 0066180 | 11/2000 |

(Continued)

OTHER PUBLICATIONS

Maudsley, et al. "Magnetic Field Measurement by NMR Imaging", J. Phys. E. Sci, Instrum. vol. 17, 1984, printed in Great Britain 022-3735/84/030216+05 © 1984 The Institute of Physics, pp. 216-220.

(Continued)

*Primary Examiner* — Brij Shrivastav
(74) *Attorney, Agent, or Firm* — Fay Sharpe LLP

(57) ABSTRACT

A water saturation shift referencing (WASSR) technique performed using a magnetic resonance scanner comprises: acquiring a spatial map of Z spectra that encompass the water center frequency using sufficiently low saturation power and sufficiently short duration selected such that symmetry of the Z spectra is not obscured by magnetization transfer but dominated by direct water saturation effects so that the spectrum is substantially symmetric; and performing a symmetry analysis on the substantially symmetric Z spectra to generate a spatial map of the water center frequency. WASSR-corrected chemical exchange saturation transfer (CEST) imaging is disclosed as an illustrative example.

20 Claims, 6 Drawing Sheets

(56) References Cited

U.S. PATENT DOCUMENTS

| | | |
|---|---|---|
| 2007/0134159 A1 | 6/2007 | Dixon et al. |
| 2008/0021306 A1* | 1/2008 | Van Zijl et al. ............... 600/419 |
| 2008/0197840 A1 | 8/2008 | Van Zijl et al. |
| 2011/0054299 A1* | 3/2011 | Ling et al. ..................... 600/410 |
| 2011/0144478 A1* | 6/2011 | Zabow et al. ................. 600/420 |
| 2011/0152671 A1* | 6/2011 | Aime et al. ................... 600/420 |
| 2011/0221440 A1* | 9/2011 | Vinogradov et al. ......... 324/309 |
| 2012/0019245 A1* | 1/2012 | Reddy et al. ................. 324/309 |

FOREIGN PATENT DOCUMENTS

| | | |
|---|---|---|
| WO | 03050521 A1 | 6/2003 |
| WO | 2006086343 A2 | 8/2006 |
| WO | 2007014004 A2 | 2/2007 |

OTHER PUBLICATIONS

Prammer, et al. "A New Approach to Automatic Shimming", Journal of Magnetic Resonance, 77, 40-52 (1988).

Tropp, et al. "Automated Shimming of B0 for Spectroscopic Imaging", Journal of Magnetic Resonance 85, 244-254 (1989).

Schneider, et al., "Rapid In Vivo Proton Shimming", Magnetic Resonance in Medicine 18, 335-347 (1991).

Webb, et al., "Rapid, Fully Automatic, Arbitrary-Volume In Vivo Shimming", Magnetic Resonance in Medicine 20, 113-122 1991).

Wolff, et al., "NMR Imaging of Labile Proton Exchange", Journal of Magnetic Resonance 86,164-169 (1990).

Guivel-Scharen, et al., "Detection of Proton Chemical Exchange between Metabolites and Water in Biological Tissues", Journal of Magnetic Resonance 133, 36-45 (1998) Article No. MN981440.

Ward, et al., "A New Class of Contrast Agents for MRI Based on Proton Chemical Exchange Dependent Saturation Transfer (CEST)", Journal of Magnetic Resonance 143, 79-87 (2000).

Goffeney, et al. "Sensitive NMR Detection of Cationic-Polymer-Based Gene Delivery Systems Using Saturation Transfer via Proton Exchange", Journal of Am. Chem. Soc. 2001, 123, 8628-8629.

Zhou, et al., "Using the Amide Proton Signals of Intracellular Proteins and Peptides to Detect pH Effects in MRI", Nature Medicine, vol. 9, No. 8, Aug. 2003, pp. 1085-1090.

Gilad, et al., "Artificial Reporter Gene Providing MRI Contrast Based on Proton Exchange", Nature Biotechnology, vol. 25, No. 2, Feb. 2007, pp. 217-219.

Van Zijl, et al., "MRI Detection of Glycogen in Vivo by Using Chemical Exchange Saturation Transfer Imaging (glycoCEST)", PNAS, vol. 104, No. 11, Mar. 13, 2007, pp. 4359-4364.

Dagher, et al., "BEST-CEST: B0-Error Shift Tracking Chemical Exchange Saturation Transfer Imaging", Proc. Int'l. Soc. Mag. Reson. Med 10 (2002) p. 611.

Sun, et al., "Optimization of the Irradiation Power in Chemical Exchange Dependent Saturation Transfer Experiments", Journal of Magnetic Resonance 175 (2005) 193-200.

Zhou, et al., "Chemical Exchange Saturation Transfer Imaging and Spectroscopy", Progress in Nuclear Magnetic Resonance Spectroscopy 48 (2006) 109-136.

Webb, et al., "Inhomogeneity Correction for in Vivo Spectroscopy by High-Resolution Water Referencing", Magnetic Resonance in Medicine 23, 1-11 (1992).

Sun, et al., "Correction for Artifacts Induced by B0 and B1 Field Inhomogeneities in pH-Sensitive Chemical Exchange Saturation Transfer (CEST) Imaging", Magnetic Resonance in Medicine 58:1207-1215 (2007).

Lagarias, et al. "Convergence Properties of the Nelder-Mead Simplex Method in Low Dimensions", SIAM J. Optim. vol. 9, No. 1, pp. 112-147 © 1998 Society for Industrial and Applied Mathematics.

Ward, et al., "Determination of pH Using Water Protons and Chemical Exchange Dependent Saturation Transfer (CEST)", Magnetic Resonance in Medicine 44: 799-802 (2000).

Zhang, et al., "PARACEST Agents: Modulating MRI Contrast via Water Proton Exchange", Accounts of Chemical Research, vol. 36, No. 10, 2003, pp. 783-790.

Spielman, et al., "Water Referencing for Spectroscopic Imaging", Magnetic Resonance in Medicine 12, 38-49 (1989).

Mulkern, et al., "The General Solution to the Bloch Equation with Constant RF and Relaxation Terms: Application to Saturation and Slice Selection", Med Phys. 20 (1), Jan./Feb. 1993 pp. 5-13.

\* cited by examiner

FREQUENCY REFERENCING FOR CHEMICAL EXCHANGE SATURATION TRANSFER (CEST) MRI

This application is a §371 US national entry of PCT/US2008/077885, filed Sep. 26, 2008 and claims the benefit of U.S. Provisional Application No. 60/995,377 filed Sep. 26, 2007. U.S. Provisional Application No. 60/995,377 filed Sep. 26, 2007 is incorporated herein by reference in its entirety.

The following relates to the medical arts, magnetic resonance arts, medical diagnostic and clinical arts, and related arts. It is described with particular reference to magnetic resonance imaging (MRI) employing the chemical exchange saturation transfer (CEST) effect. However, the following will find more general application in spatial mapping of the water center frequency or other reference frequencies for diverse applications including CEST analysis, static ($B_0$) magnetic field shimming, magnetic resonance spectroscopic analyses, and so forth.

Chemical exchange saturation transfer (CEST) is a known contrast mechanism for magnetic resonance (MR) imaging. In imaging employing the CEST effect, selective radio frequency (RF) irradiation of exchangeable solute protons, such as amide (NH), hydroxyl (OH), and sulfhydryl (SH) groups, is detected through progressive saturation of the water signal consequential to chemical exchange. Chemical exchange is a well-known magnetization transfer (MT) mechanism with a single transfer pathway. CEST is distinguishable from conventional magnetization transfer contrast (MTC) imaging based on semi-solid protons, where saturation transfer occurs in multiple steps, both through dipolar coupling and chemical exchange.

CEST can enable detection and mapping or imaging of species normally not visible in conventional MR imaging techniques. In some circumstances CEST can exhibit an effect size of a few percent on the water signal, that is, sensitivity enhancement to the molar concentration range. For instance, CEST observation of solutes and particles in the millimolar to nanomolar range has been demonstrated both in vitro and in vivo. CEST effects can be detected through irradiation of the proton spectrum as a function of frequency offset and measurement of the ratio of the water signal with saturation and without. The resulting spectrum of the ratio of the water signal with saturation and without is sometimes referred to in the art as a "Z-spectrum" or a "CEST spectrum". By employing suitable spatial encoding, representations of the Z-spectrum can be obtained on a per-voxel or per-pixel basis using a few measurements at different saturation frequencies selected to span the water frequency region. Such an image is sometimes referred to in the art as a "Z-image".

The CEST effect can be small and, if the resonance frequency of the solute protons is sufficiently close to the water frequency, the CEST effect competes with direct saturation effects and MTC effects, the latter being particularly problematic for in vivo measurements. The direct saturation effect is symmetric about the water center frequency, whereas the CEST effect is asymmetric. Accordingly, a symmetry analysis with respect to the water center frequency is typically performed to remove or suppress the symmetric component of the signal so as to visualize or enhance visualization of the CEST effect. This approach relies upon knowledge of the precise position of the water center frequency, which is the center of symmetry for the direct saturation effect.

Unfortunately, the water center frequency varies spatially in subjects measured using existing MR scanners. This is generally due to $B_0$ inhomogeneity, which can in turn be due to imperfections in the main magnet generating the $B_0$ field, or due to local field inhomogeneities due to tissue interfaces, or so forth. For in vivo measurements, local magnetic susceptibility differences are commonplace. If left uncorrected, spatial water center frequency variation tends to lead to artifactual signal spikes or undershoots in CEST images, errors in quantification of the magnitude of the CEST effect, or can even prevent detection of the CEST effect entirely. These effects can be affirmatively countered by shimming to improve $B_0$ field uniformity. However, shimming by itself has been found to be generally insufficient.

Another approach is to perform fitting (for example, using a polynomial or cubic spline or other approach) and centering of the Z-spectrum in each voxel in order to identify the water center frequency, which is then used in the symmetry analysis. This approach relies upon observable symmetry of the water saturation curve in the Z-spectrum. However, if the CEST peak substantially overlaps the water saturation curve, as in the case for OH groups in sugars for example, or if an asymmetric MT effect is also present, such as under certain in vivo circumstances, then the symmetry of the water saturation curve is obscured and finding of the precise location of the water center frequency on a per-voxel or per-pixel basis through analysis of the Z-spectra is difficult or impossible.

Other techniques, such as field mapping performed by gradient echo imaging, provide only relative information about the magnetic field inhomogeneity. Such relative techniques cannot be used to precisely identify the absolute position of the water center frequency on a per-voxel or per-pixel basis.

While CEST is referenced herein as an illustrative application, other applications would benefit from precise identification of the water center frequency on a per-voxel or per-pixel basis. For example, this information can be used as a reference point for MR spectroscopic analyses, for $B_0$ field shimming, and so forth.

The following provides new and improved apparatuses and methods that overcome the above-referenced problems and others.

In accordance with one disclosed aspect, a magnetic resonance method is disclosed, comprising: acquiring a spatial map of Z spectra that encompass the water center frequency using sufficiently low saturation power and sufficiently short saturation duration selected such that the Z spectra are not obscured by magnetization transfer (for example, CEST or MTC) and are dominated by direct water saturation effects so that the Z-spectra are substantially symmetric; and performing a symmetry analysis on the substantially symmetric Z spectra to generate a spatial map of the water center frequency.

In accordance with another disclosed aspect, a processor is disclosed that is configured to (i) cause a magnetic resonance scanner to acquire a map of Z spectra using sufficiently low saturation power and sufficiently short saturation duration selected such that the Z spectra are not obscured by magnetization transfer (i.e. CEST or MTC) and are dominated by direct water saturation effects so that the Z-spectra are substantially symmetric, and (ii) generate a map of absolute frequency reference values based on the map of substantially symmetric Z spectra.

In accordance with another disclosed aspect, a system is disclosed, comprising: a magnetic resonance scanner; and a processor configured to (i) cause the magnetic resonance scanner to acquire a spatial map of substantially symmetric Z spectra using sufficiently low saturation power and sufficiently short saturation duration selected such that the Z spectra are not obscured by magnetization transfer (i.e. CEST or MTC) and are dominated by direct water saturation effects, and (ii) generate a spatial map of water center frequency values based on the spatial map of substantially symmetric Z spectra.

One advantage resides in more accurate CEST imaging.

Another advantage resides in more precise quantitative CEST analyses.

Another advantage resides in providing precise absolute water center frequency information on a per-pixel or per-voxel basis.

Further advantages will be apparent to those of ordinary skill in the art upon reading and understand the following detailed description.

FIG. 1 diagrammatically shows a system for performing water saturation shift referencing (WASSR)-enhanced chemical exchange saturation transfer (CEST) imaging.

FIG. 2 diagrammatically shows an example of a symmetry-based center frequency search operating by minimizing the mean squared error between measured (original) WASSR symmetric Z-spectrum intensities and cubic-spline interpolated intensities of the reflected curve.

FIGS. 6A, 6B, 6C, and 6D show results for in vivo human calf muscle imaging experiments using WASSR-corrected CEST to detect glycogen.

Figure 1:
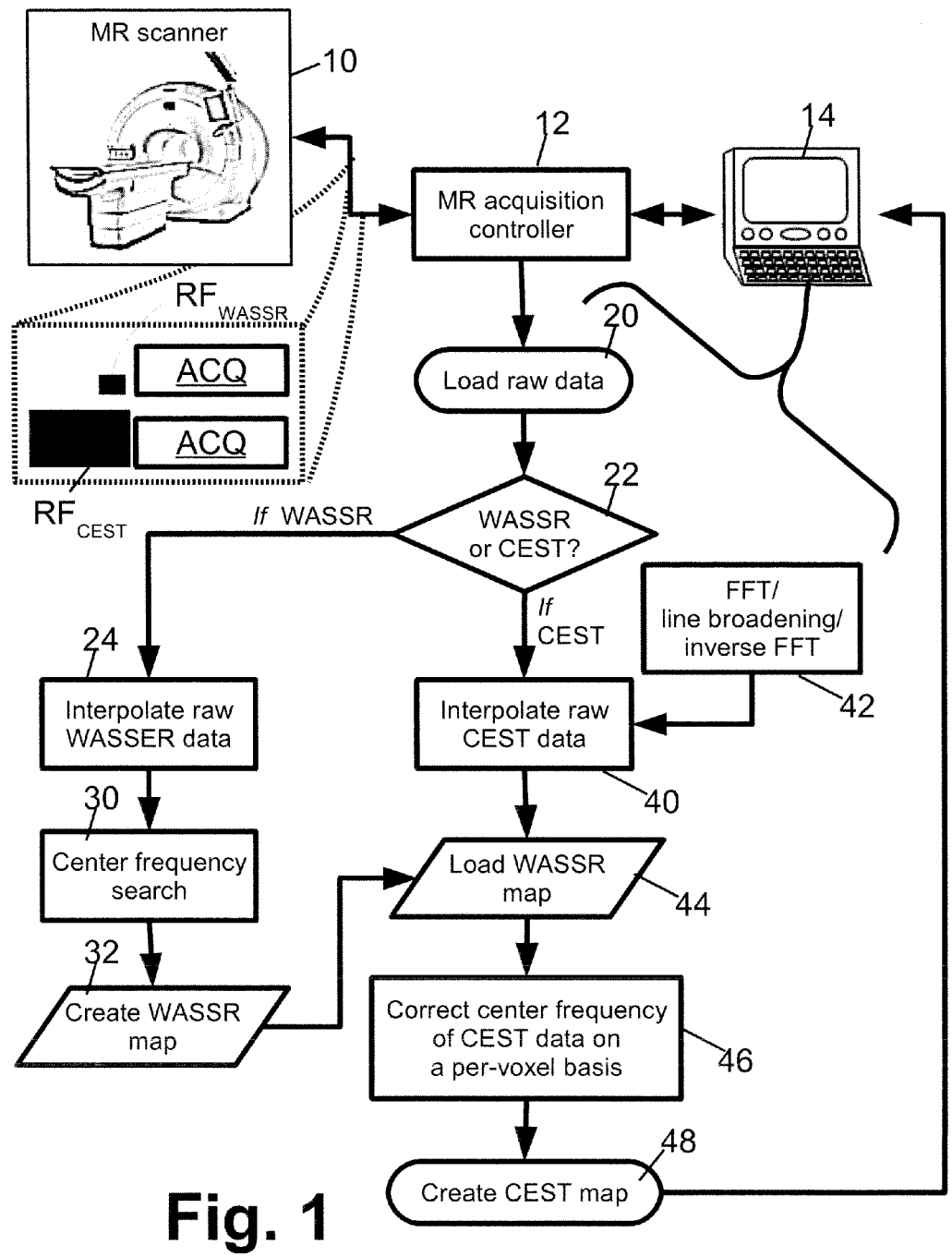

With reference to FIG. 1, a magnetic resonance (MR) scanner 10 is used to acquire MR data under the control of a MR acquisition controller 12. A user interface, such as an illustrated computer 14, enables a radiologist, technologist, or other user to operate the MR scanner 10 via the controller 12. In some embodiments, the MR controller 12 and the computer 14 or other user interface are integrated as a single unit. The illustrated computer 14 includes a processor (detail not illustrated) configured to perform operations causing the MR scanner 10 to perform selected acquisition operations to acquire selected data. The processor is further configured to perform operation to perform selected data processing. Although the processor is part of the computer 14 in the illustrated embodiment, in other embodiments a separate dedicated processor may be provided to perforin some or all data processing operations. The processing operations disclosed herein are performed by the illustrated MR acquisition controller 12 and computer 14; more generally other types of digital processing devices can be used, such as an server accessed via the Internet or a local area network. Furthermore, the disclosed processing operations may be embodied by a storage medium storing instructions executable (for example, by a processor of the computer 14) to perform the disclosed processing operations. The storage medium storing such instructions may be, for example: a magnetic medium such as a magnetic disk; an optical medium such as an optical disk; an electronic memory medium such as random access memory (RAM), read-only memory (ROM), flash memory, or so forth.

The processor is configured to perform imaging with chemical exchange saturation transfer (CEST) contrast, in which determination of the CEST effect is enabled or enhanced by the water saturation shift referencing (WASSR) technique disclosed herein. FIG. 1 diagrammatically illustrates this WASSR-corrected CEST technique, which is suitably implemented by the processor of the computer 14, or is suitably embodied by a storage medium storing instructions executable (for example, by a digital processor) to perform the WASSR-corrected CEST technique. In overview, the scanner is controlled to acquire WASSR and CEST data. The WASSR data acquisition entails acquiring a spatial map of Z spectra that encompass the water center frequency using an RF saturation pulse $RF_{WASSR}$ of sufficiently low saturation power and sufficiently short saturation duration selected such that the Z spectra are not obscured by magnetization transfer (i.e. CEST or MTC) and are dominated by direct water saturation effects, and hence are substantially symmetric. In contrast, the CEST data acquisition entails acquiring a spatial map of Z spectra that encompass the water center frequency using an RF saturation pulse $RF_{CEST}$ of sufficiently high saturation power and sufficiently long saturation duration selected such that the Z spectra exhibit a CEST feature and hence are substantially asymmetric. The same acquisition sequence ACQ can be employed after either the WASSR saturation pulse $RF_{WASSR}$ or after the CEST saturation pulse $RF_{CEST}$, as diagrammatically shown in FIG. 1. For example, the acquisition sequence ACQ can employ a turbo spin echo (TSE) image acquisition or substantially any other suitable acquisition sequence. Although the same acquisition sequence ACQ is diagrammatically illustrated for both WASSR and CEST acquisitions, it is also contemplated to employ different acquisition sequences, or different acquisition sequence parameters, in the WASSR and CEST acquisitions. WASSR and CEST data are acquired with the same prescan parameters, i.e. no adjustment of water frequency offset and no magnetic field shimming is performed between these acquisitions. WASSR can be acquired before, after, or interleaved with CEST data acquisition. After acquisition, a raw data loading operation 20 loads raw data acquired by the MR scanner 10 under control of the MR controller 12. A decision block 22 determines whether the loaded raw data is WASSR data or CEST data. WASSR data comprise a spatial map of substantially symmetric Z-spectra that encompass the water center frequency that are acquired using saturation power and duration selected such that symmetry of the Z-spectra is not obscured by magnetization transfer. In contrast, CEST data comprise a spatial map of asymmetric Z-spectra that encompass the water center frequency and that encompass a CEST-related feature, the spatial map being acquired using sufficiently high saturation power and sufficiently long duration selected such that the Z-spectra exhibit the CEST-related feature. Asymmetric Z-spectra for CEST analysis are acquired at higher saturation power and over longer duration than are symmetric Z-spectra for WASSR analysis. The CEST analysis makes use of the WASSR analysis results; accordingly, the WASSR data are processed prior to the CEST data.

Considering the WASSR analysis first, a symmetry analysis is performed on the WASSR Z-spectra to generate a spatial map of the water center frequency. In the illustrated embodiment, the WASSR Z-spectra symmetry analysis optionally entails an interpolation or data fitting operation 24 performed on each Z-spectrum to interpolate or fit the image pixel or voxel values acquired at the different saturation frequencies so as to enhance saturation frequency resolution. Any type of interpolation or fitting algorithm can be used, such as cubic spline, polynomial, or fourier transform followed by zero-fill interpolation, or fitting the data to a suitable curve. For example, it is believed that the symmetric Z-spectrum should have a generally Lorentzian shape (see Mulkern et al., "The general solution to the Bloch equation with constant rf and relaxation terms: application to saturation and slice selection", Med. Phys. vol. 20 no. 1 pp. 5-13 (1993)) and accordingly a fit to a Lorentzian shape is contemplated.

A center frequency search 30 is applied to each Z-spectrum (optionally after the interpolation or fitting 24) to identify the center of symmetry of the substantially symmetric Z-spectrum. For perfect symmetry, the center of symmetry should correspond to the frequency of the minimum of the symmetric Z-spectrum; however, imperfections in the substantial symmetry may result in some small frequency difference between the frequency of the center of symmetry and the frequency of the Z-spectrum minimum. In the illustrated embodiment, the symmetry analysis employs the center frequency search 30 based on identification of the center of symmetry; however, it is also contemplated to perform the symmetry analysis by identifying the Z-spectrum minimum (for example, by fitting the bottom of the Z-spectrum to an upward-concave quadratic function). The output of the center frequency search 30 applied to each Z-spectrum is expected to correspond to the water center frequency. In general, the water center frequency may vary spatially due to electromagnetic field inhomogeneity. Accordingly, the center frequency search 30 applied to the Z-spectra of each pixel or voxel location collectively creates a water center frequency map 32, also referred to herein as a WASSR map 32.

Turning to the CEST analysis, an interpolation or fitting algorithm 40 is again optionally applied to enhance saturation frequency resolution. In the illustrated embodiment, an approach 42 employing a fast Fourier Transform (FFT) followed by a line broadening routine followed by an inverse FFT is used; however, other interpolation or fitting algorithms are also contemplated. The WASSR map generated by the WASSR analysis is then loaded 44 and used to correct 46 the center frequency of the CEST data on a per-voxel or per-pixel basis. The corrected data are then used to perform a CEST analysis, for example by plotting the (−f,+f) asymmetry respective to the corrected water center frequency as a function of the saturation frequency f referenced to the corrected water center frequency, as is typical for CEST analysis. The CEST analysis is used to create a CEST map 48 that may be displayed on the display of the computer 14 or otherwise utilized.

Having provided an overview of the illustrative imaging system employing WASSR-corrected CEST contrast, further aspects are next set forth.

Chemical exchange saturation transfer (CEST) employs selective radiofrequency (RF) irradiation of exchangeable solute protons, such as amide (NH), hydroxyl (OH), and sulfhydryl (SH) groups, which are detected through progressive saturation of the water signal consequential to chemical exchange. Chemical exchange is a magnetization transfer (MT) mechanism with a single transfer pathway. In contrast, conventional magnetization transfer contrast (MTC) imaging based on semi-solid protons is a mechanism with multiple transfer pathways or steps, both through dipolar coupling and chemical exchange. CEST effects can be detected through irradiation of the proton spectrum as a function of frequency offset and measurement of the ratio of the water signal with saturation and without.

CEST effects can be small and, if the resonance frequency of the solute protons is sufficiently close to the water frequency, the CEST effects have to compete with direct saturation. In vivo measurement of CEST effects is further complicated by the occurrence of MTC effects. To address these interferences, the CEST mapping 48 typically employs an asymmetry analysis with respect to the water center frequency, providing an MT asymmetry ratio ($MTR_{asym}$) spectrum. This parameter is defined as:

$$MTR_{asym}(\Delta\omega) = \frac{S(-\omega) - S(\omega)}{S_0}, \qquad (1)$$

in which $\Delta\omega$ is the shift difference between the irradiation frequency and the water center frequency and $S(\omega)$ and $S_0$ are the water intensities after a long presaturation pulse at the offset frequency and without a presaturation pulse, respectively. When the direct saturation curve is quite narrow, an asymmetry analysis works quite well. When the line broadens, the distinction of the CEST effect from direct saturation becomes problematic if the chemical shift difference between the solute proton and water frequency ($\Delta\omega$) is relatively small, as is the case for the hydroxyl (OH) protons of glycogen ($\Delta\omega$=0.75-1.25 ppm). However, if the water frequency is known exactly, an asymmetry analysis still provides the correct CEST effect. It is the use of the WASSR spectrum that provides the requisite exact knowledge of the water center frequency on a per voxel or per pixel basis, even in the presence of magnetic field inhomogeneities.

In the WASSR technique, absolute water frequency referencing is accomplished by acquiring a pure direct water saturation image. This can be done by using RF irradiation that is of sufficiently small power and sufficiently short duration to have negligible interference of magnetization transfer effects (both MTC and CEST). The WASSR Z-spectrum isolates the effect of direct water saturation. Advantageously, the shape of the direct water saturation Z-spectrum is not affected by field inhomogeneities, making it substantially symmetric with respect to its center frequency (that is, the point of minimum intensity). Thus, the center of the direct saturation curve can be found by equalizing the frequency differences between its rising and falling slopes using a symmetry analysis. The position of this symmetric line is affected by the local magnetic field, which varies between voxels or pixels due to differences in magnetic susceptibility.

Figure 2:
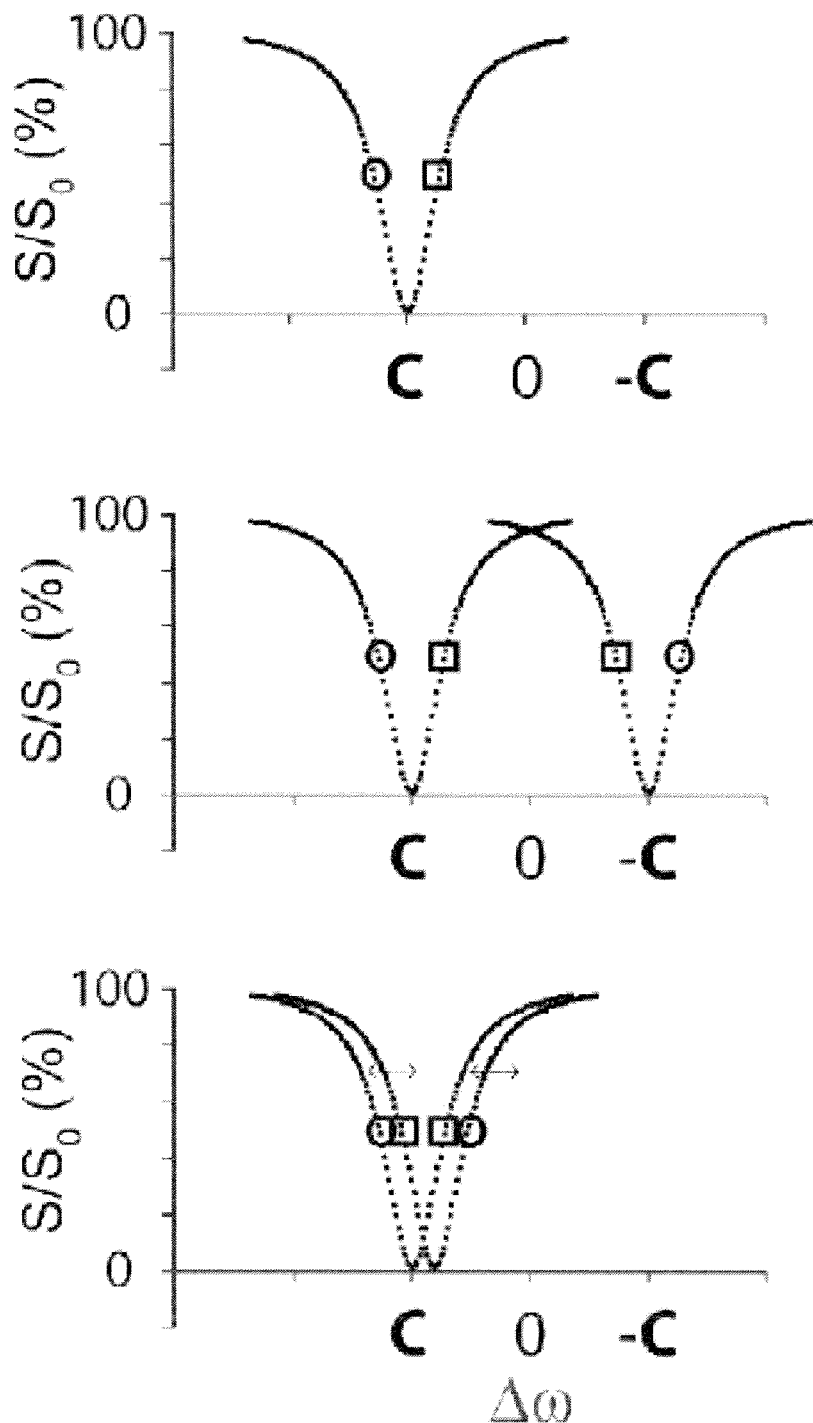

With reference to FIG. 2, an example is provided of one type of asymmetry analysis that can be performed to determine the water frequency offset in each voxel or pixel. In this example, the observed signal f(x), shown in the topmost plot of FIG. 2, is reflected to create a mirror image with respect to the experimentally found water frequency, as shown in the middle plot of FIG. 2. Optionally, interpolation or curve fitting is used to improve saturation frequency resolution. For example, in the illustrated embodiment the mirror-reflected curve is interpolated 24 using a cubic spline interpolation algorithm or using another interpolation algorithm. In other embodiments, the original curve, or both curves, may be interpolated or fitted with suitable interpolation approaches to enhance saturation frequency resolution. The center frequency search 30 in some illustrative embodiments operates by minimizing the mean squared error between the (interpolated) intensities of the measured and reflected curves using the following discrete energy function:

$$MSCF = \underset{C}{\operatorname{argmin}}\left((f(x_i) - \tilde{f}(2C - x_i))^2\right)_{x_{(1)} \le 2C - x_i \le x_{(N)}}, \qquad (2)$$

where MSCF represents "maximum-symmetry center frequency", the Z-spectrum is denoted $f(x_i)$ with $x_i$, i=1, ..., N denoting N different saturation frequencies of the Z-spectrum, and $\tilde{f}(2C-x_i)$ is the reflected and interpolated or fitted copy of the Z-spectrum denoted $f(x_i)$. The bottommost curve in FIG. 2 illustrates the situation with the water frequency center parameter C approaching the best fit value. In a suitable implementation, the maximum-symmetry center frequency (MSCF) estimator executed argument of minimum (argmin) over a sum (< >) of mean squared error and numerical optimization is performed with a Nelder-Mead simplex direct search method (see Lagarias et al., "Convergence Properties of the Nelder-Mead Simplex Method in Low Dimensions", SIAM J. on Optimization vol. 9 no. 1, 112-147 (1998)). Search initialization was achieved by selecting the median frequency of points that are at half the median intensity height. Other initializations are also contemplated. The mean estimated power is taken only over the points that are sampled; accordingly, the estimate of C is restricted to the lie within the range of frequencies that are sampled. Symmetry analysis is not possible using this illustrative approach without acquiring at least some samples around the point of symmetry, which entail acquisition of a minimum number of points depending on the width of the saturation curve and the chosen spectral width of the Z-spectrum. The latter depends on the range of frequency shifts over the sample.

Monte Carlo simulations were performed to estimate optimal parameters for WASSR imaging, including the WASSR Sweep Width (WSW) and the number of WASSR points (WN) to effectively cover the WSW. The width and shape of the direct saturation curve to be covered was determined by simulations using the exact steady state solution for water magnetization during saturation as provided by Mulkern et al., "The general solution to the Bloch equation with constant rf and relaxation terms: application to saturation and slice selection", Med. Phys. vol. 20 no. 1 pp. 5-13 (1993)). In terms of signal intensity, this gives:

$$S(x)/S_0 = \frac{R_1[R_2^2 + \{\Delta\omega(x)\}^2]}{R_1[R_2^2 + \{\Delta\omega(x)\}^2] + \omega_1^2 R_2}, \quad (3)$$

where $R_1=1/T_1$ (longitudinal relaxation), $R_2=1/T_2$ (transverse relaxation), $\omega_1=\gamma B_1$ and $\Delta\omega=\omega-\omega_0$ denotes the offset of the signal point (x) with respect to the center frequency. The optimal WSW was investigated in terms of a ratio with respect to the WASSR Line Width (WLW) as defined by the Full-Width at Half Minimum of the saturation lineshape. Calculation of the line width of a lineshape such as Equation (3) is suitably done by determining the frequency offset ($\Delta\omega=\omega-\omega_0$) at half height ($S/S_0=0.5$ for full saturation). However, for the direct saturation lineshapes used here, this is not straightforward because the saturation is generally not 100% at $\Delta\omega=0$. Accordingly, the actual signal intensity $S(\Delta\omega=0)/S_0$ was calculated and subtracted from the reference intensity ($S/S_0=1$) and determined the frequency at half height from that. The result is:

$$WLW(\text{Hz}) = \left(\frac{1}{\pi}\right)\sqrt{\frac{R_1 R_2^2 + \omega_1^2 R_2}{R_1}}. \quad (4)$$

The WASSR points were applied equally spaced within the WSW as this is most practical when the field varies over a sample and shifts the saturation curve over multiple frequencies. In the illustrative embodiments, the center frequency of the saturation curve is suitably found using the maximum symmetry algorithm performed by the center frequency search 30. The absolute error in this frequency (offset error) was simulated for different ratios WSW/WLW as a function of WN and SNR. The noise used was Rician and SNR was taken for water signal without saturation, defined as $SNR(S_0)$.

To estimate the frequency shift, the center frequencies were modelled as a zero-mean normal distribution (N) with standard deviation of WLW at each spectrum as follows:

$$P(\omega_0)=N(0,WLW) \quad (5).$$

For each WSW/WLW ratio and WN, the expected mean absolute error was estimated with 1275 Monte Carlo iterations at a simulated $SNR(S_0)$ of 100:1. The set of pairs of best WSW/WLW ratios (that is, minimum offset error) at a certain WN was fitted with a logarithmic form to generate an expression for the optimal ratio when using a certain number of points:

$$i\,WSW/WLW = A \times \log[WN] + B \quad (6a),$$

where A and B are the fitting parameters. Using this expression, the expected WASSR offset error was computed as a function of WN for $SNR(S_0)$ values of 10:1, 20:1, 40:1, 80:1, 100:1, and 1000:1. Again, each expected WASSR error computation employed 1275 Monte Carlo iterations. To determine the variability of parameter fit, these Monte Carlo experiments were repeated 25 times.

In addition to Monte Carlo simulations, imaging experiments were performed to demonstrate the WASSR technique. In phantom imaging experiments, a 200 mM solution of bovine liver glycogen (Type 1×G0885-25G, available from Sigma, St. Louis, Mo.) with an average molecular mass of about 50 kD was prepared by dissolving 4.98 g of glycogen in 151 ml of phosphate buffered saline (pH 7.3). The glycogen concentration is expressed in glycosyl units, with each glucosyl unit contributing 168 g/mol [(4980 mg/168 mg/mmol)/151 ml]=0.2 M]. Human imaging studies (approved by the Johns Hopkins Medicine Institutional Review Board and the Kennedy Krieger Institute, with all subjects providing signed consent) were performed on four healthy subjects (two females and two males, 33±10 years and 68±9 kg, Mean±STD). During imaging the human subjects were kept in the resting state about 0.5 to 1 hour to maintain the baseline before they were scanned to measure the glycogen CEST effect in calf muscle. All images were acquired using a whole-body Philips 3T Achieva scanner (available from Philips Medical Systems, Best, The Netherlands) equipped with 80 mT/m gradients. RF was transmitted using the body coil and SENSE reception was employed. A series of consecutive direct saturation (WASSR) and CEST scans were performed using an 8-element knee coil for both the glycogen phantom and in vivo human calf muscle. To minimize leg motion, foam padding was placed between the subject's lower leg and the knee coil. In all imaging experiments, second order shims over the entire muscle on the imaging slice were optimized to minimize $B_0$ field inhomogeneity. For both WASSR and CEST scans, saturation was accomplished using a rectangular RF pulse before the turbo spin echo (TSE) image acquisition. See Jones et al., "Amide proton transfer imaging of human brain tumors at 3T", Magn. Reson. Med. vol. 56 no. 3, pp. 585-592 (2006). Note that any type of acquisition chosen is fine and that TSE is just one of many possible acquisition sequences that can be employed.

The width of Z-spectra depends on $T_2$ and the WASSR procedure as disclosed herein provides an absolute field frequency map. Accordingly, there is advantageously no particular need for higher order shimming for the CEST acquisition. Clinical imagers generally employ a prescan to center the bulk water signal of the object or subject, optimize the flip angle and shim the field. For WASSR-corrected CEST, no such prescan should be made between the WASSR and CEST scans, because the WASSR in effect measures the field inhomogeneity which is represented by the WASSR map. Thus, by omitting the prescan between the WASSR and CEST acquisitions, the same field reference conditions are maintained so that the WASSR map is informative respective to the field inhomogeneities during the CEST acquisition.

The power level needed for each saturation experiment depended on the load and was optimized by measuring sets of Z-spectra under these different conditions. For WASSR, the power and pulse lengths were chosen as small as possible to have sufficient direct saturation, while minimizing any MT effects. For CEST, the maximum pulse length allowed for the body coil within the protected clinical software (500 ms) was used and the power was optimized for maximum effect at the phantom and muscle loads. WASSR was obtained at higher frequency resolution than CEST, but over a smaller frequency range as only the direct saturation region needs to be covered. The WASSR range was chosen sufficiently large to validate the simulated results, consequently leading to a larger number of frequencies needed in vivo (that is, in the human imaging experiments) than for the phantom. In practice this can be reduced depending on the desired accuracy of the water center frequency.

Single-slice glycogen phantom imaging was performed using SENSE factor=2, TSE factor [that is, number of refocusing pulses]=34 (two-shots TSE), TR=3000 ms, TE=11 ms, matrix=128×122, FOV=100×100 mm$^2$, slice thickness=5 mm, NSA=1. Imaging parameters for human calf muscle experiments were identical to those in phantom experiments except for the following: FOV=160×160 mm$^2$. The saturation spectral parameters used for these particular WASSR and CEST acquisitions are indicated in Table 1. To determine $S_0$, two additional data points were acquired; one with saturation pulse at 15.63 ppm and one without saturation. Parameters in Table 1 are not optimized in terms of timing; total scan time can be reduced by decreasing the acquisition matrix size and number of offset point. The offset in Table 1 is chemical shift difference with respect to water frequency Experimental data were acquired and processed in accordance with the WASSR-corrected CEST technique disclosed herein using a program written in Matlab (available from Mathworks, Natick, Mass., USA). For efficiency of the processing, the background around the object was masked by excluding data points below the 50th percentile of voxel intensity. The data processing is divisible into reconstruction of a WASSR map and a CEST map, as shown in FIG. 1. To create a WASSR map, the WASSR spectrum from each voxel was cubic-spline interpolated 24 and the center frequency was determined 30 by the maximum-symmetry algorithm followed by search initialization of the center frequency as described with reference to Equation (2). The frequency difference between optimized center frequency and 0 ppm (that is, the experimental water frequency) for each voxel was stored 32 to the WASSR map. To create a CEST map, the CEST spectrum in each voxel was interpolated 40 using a fast fourier transformation (FFT). First, 33 original raw CEST data points in the range of −4 to 4 ppm (frequency-domain) were transformed to the time-domain. Second, the transformed CEST data in time-domain were processed by 2 Hz line-broadening and zero-padding. Third, the processed CEST data in time-domain were inverse-transformed to frequency domain. Overall, 33 points were interpolated to 2048 points. Subsequently, the frequency difference from the WASSR map was applied to correct 46 the CEST Z-spectrum on a voxel-by-voxel basis. Finally, the $MTR_{asym}$ intensity computed by Equation (1) was integrated over the 0-2 ppm range on a voxel-by-voxel basis to produce the CEST map 48. CEST data in different regions of interest (ROIs) were quantified for 4 subjects. Four different regions of 35±0.8 voxels (mean±STD) were chosen for calf muscle in each subject.

Figure 3A:
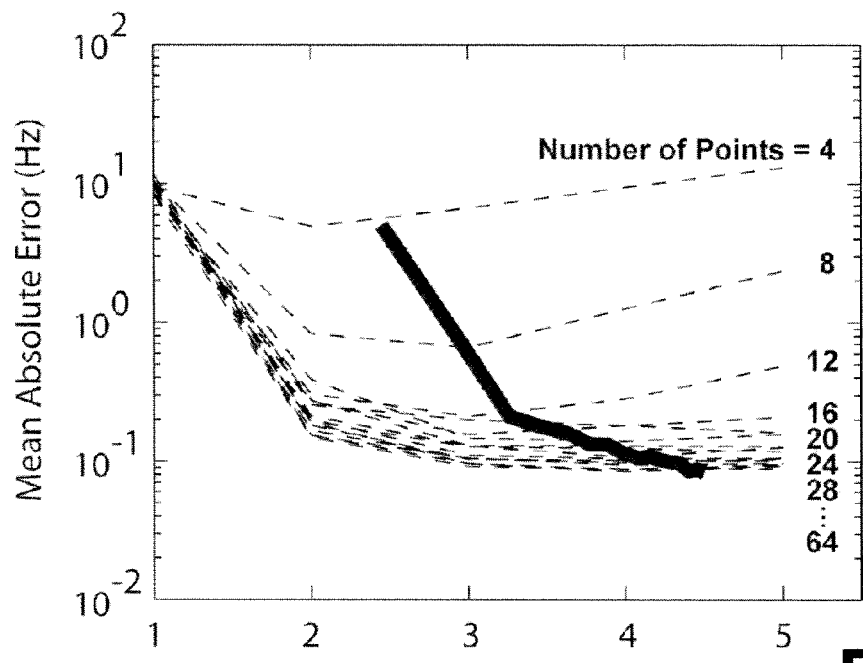
FIGS. 3A and 3B show results for Monte Carlo simulations to estimate the size of the mean absolute error in the WASSR center frequency as a function of WASSR sweep width, line width and number of points sampled.
Figure 3B:
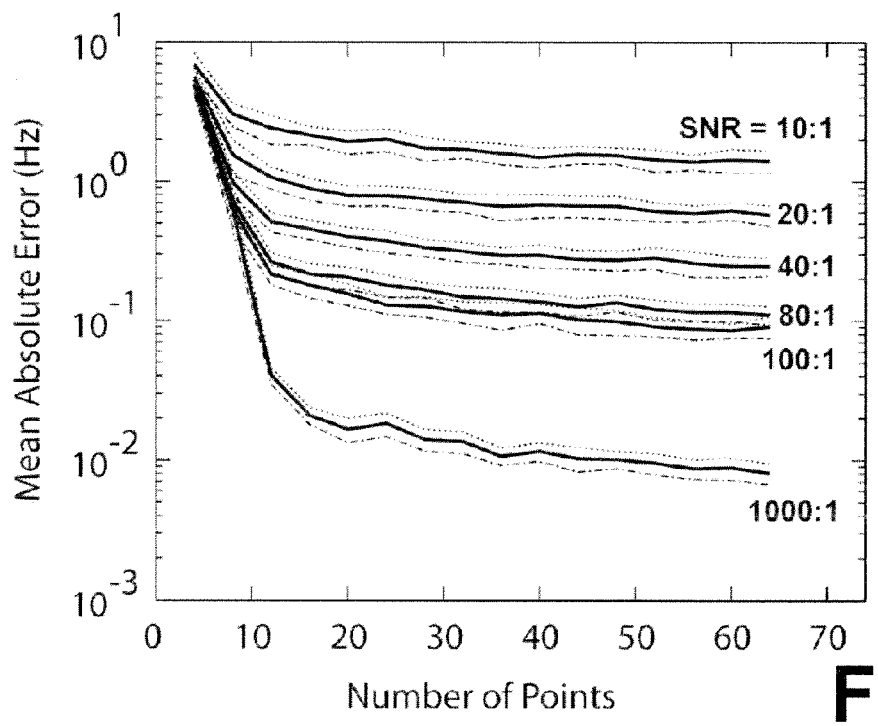

With reference to FIGS. 3A and 3B, simulation results are described to determine the required number of WASSR points to be acquired for a certain accuracy of the water center frequency determination. In FIG. 3A, simulations of the error in the determined center frequency of the direct saturation curve (WASSR map frequency) are shown as a function of the WASSR sweepwidth-to-linewidth ratio (WSW/WLW) under different sampling conditions using a signal to noise ratio without saturation, $SNR(S_0)$, of 100:1. It is observed that 12 WASSR points within 3.25 times WSW/LW result already in sub-Hz error. The relationship between the predicted optimal ratio (WSW/WLW at minimized mean absolute error) and number of points (thick solid line in FIG. 3A) was fitted to be:

$$WSW/WLW=(0.78\pm0.17)\times\log[WN]+(1.25\pm0.49) \quad (6b),$$

FIG. 3B plots this optimal ratio at different WASSR resolution values as a function of SNR. It is found that the estimated absolute offset error already falls into sub-Hz range when using 16 points at a $SNR(S_0)$ of 40:1 and smaller at higher SNR. Considering that the $SNR(S_0)$ for typical WASSR data is around 100:1 for humans and over 1000:1 for phantoms, these results imply that using a WSW/WLW ratio of 3.3-4 with sampling of 16-32 points is a good general guideline for WASSR imaging if the requirement for the offset error is to be less than about 0.3 Hz.

Figure 4A:
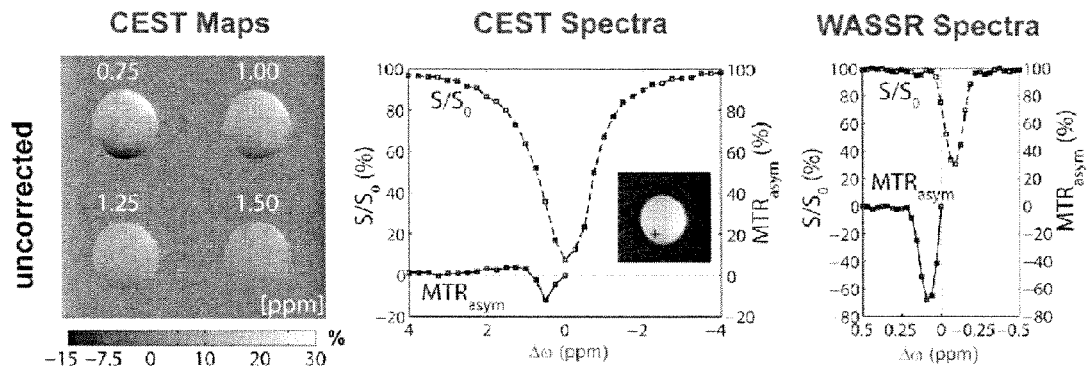
FIGS. 4A and 4B and 5A and 5B show results for phantom imaging experiments using WASSR-corrected CEST to detect glycogen.
Figure 4B:
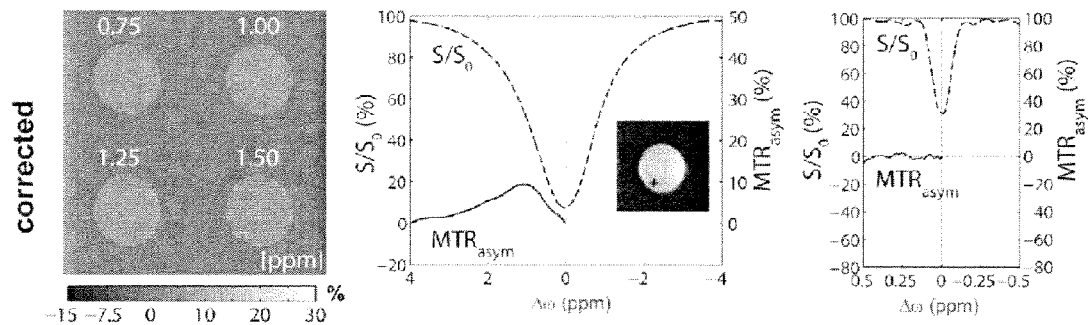

With reference to FIGS. 4A and 4B, the glycogen phantom results for WASSR-corrected CEST are described. FIG. 4A shows a typical series of CEST maps obtained for a glycogen phantom after optimized shimming, placing the transmitter offset on the average water resonance frequency as determined experimentally by the prescan, and voxel-by-voxel determination of $MTR_{asym}$. The CEST images are shown for the offset frequency where glycogen CEST (glycoCEST) signals are expected to be optimal, namely between 0.75 and 1.5 ppm from water. A clear spatial intensity fluctuation is visible for this homogeneous solution. When looking at the corresponding CEST Z-spectrum acquired in a single voxel placed as indicated at the accompanying image, it is not clear whether the data are centered correctly, because only a single, rather broad saturation curve is visible representing the com-

TABLE 1

WASSR and CEST imaging parameters used in imaging experiments.

| | | duration (ms) | power (μT) | offset range (ppm) | number of offsets | FOV (mm$^2$) | NEX | time (min:sec) |
|---|---|---|---|---|---|---|---|---|
| phantom | WASSR | 50 | 0.10 | −0.5 to 0.5 | 33 | 100 × 100 | 1 | 3:33 |
| | CEST | 500 | 1.50 | −4 to 4 | 33 | 100 × 100 | 1 | 3:33 |
| Calf muscle | WASSR | 100 | 0.25 | −1 to 1 | 33 | 160 × 160 | 1 | 3:33 |
| | CEST | 500 | 0.75 | −4 to 4 | 33 | 160 × 160 | 1 | 3:33 | bined effects of CEST and direct saturation. However, the corresponding narrow WASSR Zspectrum, which has negligible MTC and CEST effects due to the use of brief low power saturation, clearly shows that the spectrum was not centered properly, resulting in a non-zero WASSR $MTR_{asym}$. The frequency shift of the center of the direct saturation curve in this particular voxel was 0.08 ppm (or 10.6 Hz) off center, illustrating the sensitivity of the WASSR approach due to the steep slope of the saturation curve. Even though this shift difference is small, the CEST $MTR_{asym}$ spectrum (middle of FIG. 4A, solid line) shows a clear deviation from zero.

With reference to FIG. 4B, the CEST maps after WASSR correction (left of FIG. 4B) show remarkable improvement in image homogeneity, compared to maps without (left of FIG. 4A). The spatial distribution of signal intensity is more uniform over the phantom and CEST maps show maximum signal in the range of about 0.75-1.25 ppm frequency offset, corresponding to the glycogen OH proton frequency range. Note that the erroneous $MTR_{asym}$ peak (right of FIG. 4A, solid line) disappears in the corrected WASSR spectrum (right of FIG. 4B, solid line), confirming that the symmetric direct saturation spectrum was centered properly.

Figure 5A:
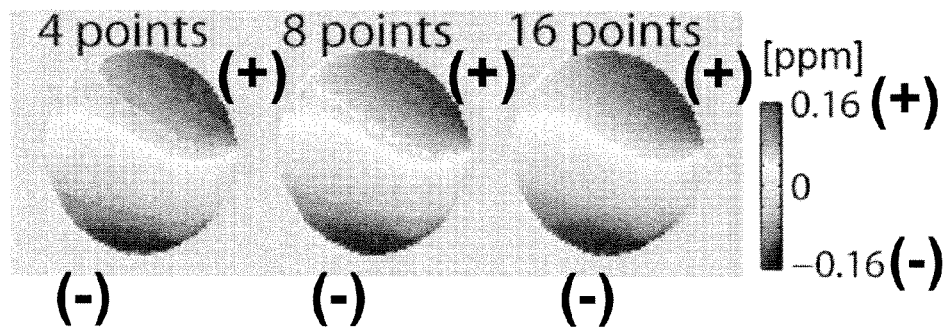
Figure 5B:
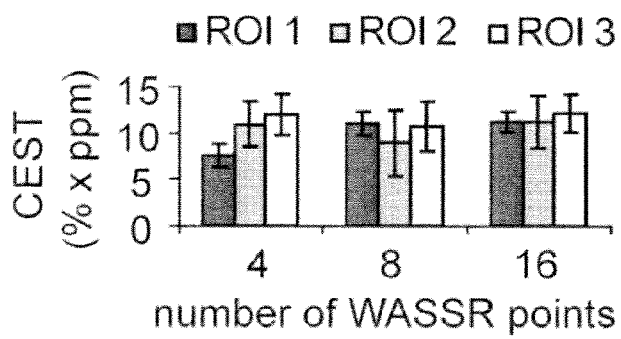
Figure 5B:
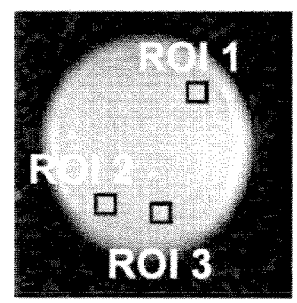

FIG. 5A shows WASSR maps and FIG. 5B shows CEST $MTR_{asym}$ signal processed as a function of the number of WASSR points (WN). Table 2 summarizes these results in tabular form. WASSR data initially acquired with thirty-three points within 1 ppm (±0.5 ppm) were rearranged with three sets of WASSR data as following: four points within 0.375 ppm, eight points within 0.5 ppm and sixteen points within 0.5 ppm. In FIG. 5A, WASSR maps show that more detailed information becomes visible when using more points. In FIG. 5B, three different regions of 12±2.7 voxels were defined as shown in a scout phantom image (right side of FIG. 5B). Insufficient WASSR sampling results in inhomogeneous and erroneous CEST $MTR_{asym}$ signal in these regions. The results suggest that a minimum of 16 points over 0.5 ppm was suitable to quantify the integral for this phantom.

In FIG. 5A, the grayscale shows both large positive and large negative values as dark pixels; accordingly, the "(+)" and "(−)" notation is used to distinguish. In each WASSR map of FIG. 5A, the large negative values are in the bottom or bottom left and the large positive values are in the top or upper right. While visual inspection of the WASSR maps in FIG. 5A does not show any readily apparent difference, the effect of WN choice on quantification is readily apparent when looking at the $MTR_{asym}$ numbers (FIG. 5B and Table 2). When using WN=16, a glycoCEST effect that is consistent around 11.2-12.2% can be found for ROIs reflecting regions with different local fields as indicated in the accompanying reference image. The average glycoCEST effect for this phantom was 11.5%.

TABLE 2

WASSR-corrected glycoCEST $MTR_{asym}$ in 200 mM glycogen phantom

|  | 4 points | 8 points | 16 point |
| --- | --- | --- | --- |
| ROI 1 | 7.5 | 11.0 | 11.2 |
| ROI 2 | 10.9 | 8.9 | 11.2 |
| ROI 3 | 12.0 | 10.7 | 12.2 |
| Mean | 10.1 | 10.2 | 11.5 |
| STD | 2.3 | 1.1 | 0.6 |

Figure 6A:
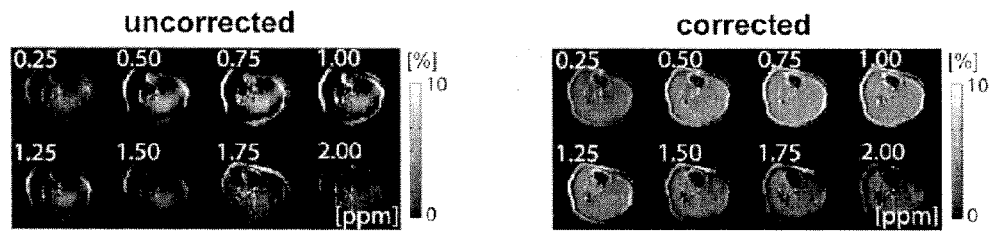
Figure 6B:
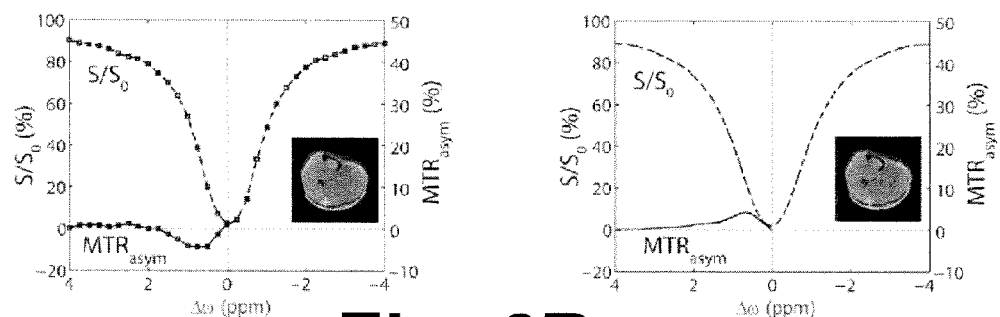
Figure 6C:
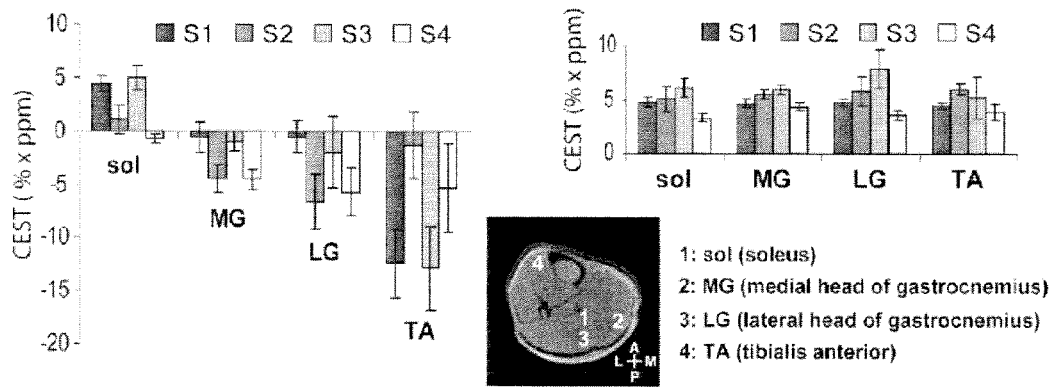
Figure 6D:
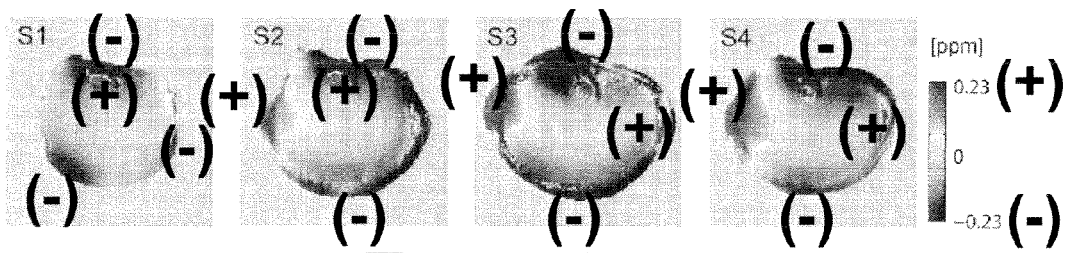

With reference to FIGS. 6A-6D and with further reference to Table 3, example human studies are described. glycoCEST maps in human calf muscle before and after WASSR correction. In FIG. 6A, CEST maps before correction (left) show a large spatial intensity fluctuation over the entire calf muscle, while the WASSR-corrected maps (right) show substantial improvement in image homogeneity. In FIG. 6B, the glycogen CEST effect is difficult or impossible to identify without $B_0$ correction, as shown in the $MTR_{asym}$ plot (left), while the corrected $MTR_{asym}$ plot (right) readily shows the glycogen CEST effect (0-2 ppm frequency range), known to correspond to the glycogen OH protons. In FIG. 6C, quantification of $MTR_{asym}$ signal (integral over 0-2 ppm range) is shown for four different muscle regions of 35±0.4 (mean±STD) voxels. All subjects show consistent CEST signal with WASSR-correction (right), while uncorrected CEST plots show erroneous and negative CEST signal (left). In the inset map of FIG. 6C and in Table 3, the abbreviations are: sol, soleus; MG, medial head of gastrocnemius; LG, lateral head of gastrocnemius; TA, tibialis anterior; A, anterior; P, posterior; L, lateral; M, medial. In FIG. 6D, the corresponding WASSR maps are shown for each subject S1, S2, S3, and S4. In FIG. 6D, the grayscale shows both large positive and large negative values as dark pixels; accordingly, the "(+)" and "(−)" notation is used to distinguish.

TABLE 3

WASSR-corrected glycoCEST $MTR_{asym}$ for in vivo calf muscle

|  | sol | MG | LG | TA |
| --- | --- | --- | --- | --- |
| S1 | 4.8 | 4.7 | 4.8 | 4.5 |
| S2 | 5.1 | 5.6 | 5.8 | 6.0 |
| S3 | 6.1 | 6.0 | 7.9 | 5.3 |
| S4 | 3.3 | 4.4 | 3.6 | 3.9 |
| Mean | 4.8 | 5.2 | 5.5 | 4.9 |
| STD | 1.2 | 0.7 | 1.8 | 0.9 |

These studies on human calf muscle evaluated whether the WASSR method can be used to elucidate the hidden glycoCEST effects in tissue at 3T. FIG. 6A shows the initial CEST maps (left) for subject S1 obtained without correction. Similar to the phantom, large signal fluctuations are found, which might (in the absence of WASSR enhancement) be erroneously interpreted as variations in glycogen content in different muscle regions. When looking at the corresponding CEST Z-spectrum in a single voxel placed in a gastrocnemius calf muscle, it appears to be centered properly. This is due to the convolution of CEST, MTC and direct saturation effects, which, at the power level needed to see a CEST effect, merge together into a single broad saturation curve at this low field strength. However, the water offset is provided by the WASSR Z-spectrum, similar to the phantom results. The frequency shift of this particular voxel is about 0.08 ppm (or 10.29 Hz), while shift variation over the entire cross-section of calf muscle was found to be around 0.47 ppm (or 60 Hz) in WASSR maps for the four subjects (FIG. 6D). When applying the WASSR-based shift correction in each voxel, the glycoCEST maps show improved spatial homogeneity over the calf muscle (right of FIG. 6A). The corresponding CEST $MTR_{asym}$ plot shows positive signal intensity of about 6% within the expected frequency range for glycogen and close-to-zero intensity outside that range. In FIG. 6C, the integrated glycoCEST signal (range 0-2 ppm) before (left) and after (right) WASSR correction is compared for four subjects. While uncorrected glycoCEST numbers show large variations, the WASSR corrected values are more consistent and of lower standard error. The results show that glycoCEST values in different muscle regions can be quantified if proper absolute water frequency correction is applied using the disclosed WASSR enhancement technique, whereas uncorrected CEST values show random variation, including erroneous negative numbers.

The WASSR enhancement uses direct water saturation to precisely (for example, with sub-Hz accuracy) map the absolute water frequency on a voxel-by-voxel basis. The disclosed WASSR acquisition employs a brief low-power RF saturation pulse, for which magnetization transfer effects (both CEST and MTC) are minimized and for which the direct water saturation spectrum is much narrower than during the CEST acquisition, where higher power broadens the curve.

When WASSR is used to provide water center frequency reference information for CEST studies, it is desired that the magnetic field be unchanged between the WASSR and CEST acquisitions. Toward this end, it is advantageous to not perform a separate prescan (shimming and water offset determination) between the WASSR mapping and the CEST acquisition. The in vivo human studies disclosed herein show that glycoCEST effects could be detected at 3T in vivo in muscle even though, at this field strength, the glycoCEST resonance overlaps so much with the direct saturation curve that a separate resonance cannot be distinguished.

Accuracy of the WASSR method is expected to depend on the magnetic resonance acquisition parameters used to acquire the data and the experimental conditions. Parameters of interest include the line width of the direct saturation curve and the spread of the magnetic field over the region of interest, which together determine the choice of sweep width and the number of points suitable for sampling the frequency spread. Based on the Monte Carlo simulations reported herein, the optimum range of WSW was found to be 3.3-4 times the WLW with a minimum sampling requirement of 16 points in order to achieve a sub-Hertz (<0.3 Hz) offset error for SNR ($S_0$) values of 80 or more. The use of a small WN is possible due to the use of symmetry analysis that takes into account the complete WASSR Z-spectrum to estimate the center frequency. The foregoing sampling guideline was found to be well applicable in the glycogen phantom and in vivo in muscle, but larger values of WSW/WLW may be advisable for organs with large field variations and motion effects, such as the liver. In anatomical regions where respiratory motion is an issue, data acquisition is optionally gated or triggered to the respiration to secure similar electromagnetic field patterns between WASSR and the CEST acquisitions. In addition, the time between the two acquisitions should be kept reasonably short. For the results reported herein, comparable resolution was used for CEST and WASSR, but a reduction of the number of phase-encodes in WASSR by at least a factor of two should be feasible, which would reduce the reference scan time to only 1-2 min.

Glycogen hydroxyl groups resonate around 0.75 and 1.25 ppm from water and, at the RF power levels needed for CEST magnetization transfer, cannot be distinguished as a separate resonance in the Z-spectrum at the field of 3T. In the phantom, the glycoCEST effect thus appears as an asymmetric broadening of the direct water saturation curve, thereby complicating its detection due to uncertainty about the exact water frequency offset. Without the WASSR referencing the CEST maps showed positive and negative MTR asymmetries indicating that it is not possible to reproducibly discern glycogen. When correcting for the absolute water frequency using WASSR, a homogeneous glycogen distribution could be detected when using 16 or more points for the frequency mapping, in line with expectations based on the Monte Carlo simulations. The averaged $MTR_{asym}$ for 200 mM glycogen was about 11.5±0.6%.

In the reported WASSR-corrected CEST imaging of glycogen in the calf muscle, the results for the four subjects S1, S2, S3, S4 showed that WASSR correction enabled detection of reproducibly positive glycoCEST effects. Such in vivo glycogen MRI studies employing the disclosed WASSR-corrected CEST can be used for diagnosis or clinical monitoring of diseases such as obesity, insulin resistance and Type-2 diabetes. The resulting quantified CEST effects in Table 3 give a range of $MTR_{asym}$ values of 4.8-5.5% for four different muscles, the soleus, the medial and lateral heads of the gastrocnemius, and the tibialis anterior. Based on the phantom result, this would correspond to a glycogen concentration of around 100 mM or less in the leg, which is not unreasonable. See Price et al., "13C-NMR measurements of muscle glycogen during low-intensity exercise", J. Appl. Physiol. Vo. 70 no. 4 pp. 1836-44 (1991), which reports a glycogen concentration around 50-100 mM.

The WASSR technique has been described herein with reference to its application in WASSR-corrected CEST imaging. However, WASSR is expected to find application anywhere in which an accurate determination of the water center line as a function of position is advantageous. For example, WASSR is expected to be useful in magnetic resonance spectroscopy techniques. In such an approach, the WASSR map is acquired, followed by acquisition of a spatial map of magnetic resonance spectra. The spatial map of MR spectra are then corrected for spatially varying frequency shifts using the spatial map of the water center frequency (that is, the WASSR map).

Further, while the WASSR technique applied to the water center line is described, it is also contemplated to apply the technique of acquiring a map of substantially symmetric Z-spectra using saturation power and duration selected such that symmetry of the Z-spectra is not obscured by magnetization transfer and generating a map of absolute frequency reference values based on the map of substantially symmetric Z-spectra to species other than water protons.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance method comprising:
    acquiring a spatial map of Z-spectra that encompass the water center frequency using saturation power and duration selected such that the Z-spectra are not obscured by magnetization transfer and are dominated by direct water saturation effects so that the Z-spectra are substantially symmetric; and
    performing a symmetry analysis on the substantially symmetric Z-spectra to generate a spatial map of the water center frequency.

2. The magnetic resonance method as set forth in claim 1, wherein the saturation duration is selected to be substantially shorter than a duration effective for generating an interfering magnetization transfer effect in the Z-spectra.

3. The magnetic resonance method as set forth in claim 2, wherein the saturation power is selected to be substantially lower than a power effective for generating an interfering magnetization transfer effect in the Z-spectra.

4. The magnetic resonance method as set forth in claim 1, wherein the acquiring a spatial map of substantially symmetric Z-spectra comprises:

acquiring images at different saturation frequencies effective to provide a substantially symmetric Z-spectrum at all pixel or voxel locations of the spatial map.

5. The magnetic resonance method as set forth in claim 4, wherein the acquiring of images comprises acquiring images at a sufficient number of different saturation frequencies collectively encompassing the water center frequency.

6. The magnetic resonance method as set forth in claim 4, further comprising:
interpolating or fitting the Z-spectra to enhance saturation frequency resolution prior to the symmetry analysis.

7. The magnetic resonance method as set forth in claim 6, wherein the interpolating or fitting comprises:
interpolating or fitting the Z-spectra using an interpolation or fitting approach selected from a group consisting of a cubic spline interpolation algorithm, a polynomial interpolation algorithm, an algorithm employing Fourier transform followed by line broadening, zerofilling and inverse Fourier transform.

8. The magnetic resonance method as set forth in claim 1, further comprising:
acquiring a spatial map of asymmetric Z-spectra that encompass the water center frequency and that encompass a CEST-related feature using sufficiently high saturation power and sufficiently long duration selected such that the Z-spectra exhibit the CEST-related feature; and
correcting the CEST-related feature in the asymmetric Z-spectra by removing spectral components that are symmetric about the water center frequency identified by the spatial map of the water center frequency.

9. The magnetic resonance method as set forth in claim 8, further comprising:
generating a water saturation shift referencing (WASSR)-corrected CEST map derived from the corrected CEST-related feature in the asymmetric Z-spectra; and
displaying an image corresponding to the WASSR-corrected CEST map.

10. The magnetic resonance method as set forth in claim 1, further comprising:
acquiring a spatial map of magnetic resonance spectra; and
correcting the spatial map of magnetic resonance spectra for spatially varying frequency shifts using the spatial map of the water center frequency.

11. A processor configured to (i) cause a magnetic resonance scanner to acquire a map of Z-spectra using sufficiently low saturation power and sufficiently short saturation duration selected such that symmetry of the Z-spectra are not obscured by magnetization transfer and are dominated by direct water saturation effects so that the Z-spectra are substantially symmetric, and (ii) generate a map of absolute frequency reference values based on the map of substantially symmetric Z-spectra.

12. The processor as set forth in claim 11, configured to cause the magnetic resonance scanner to acquire the map of substantially symmetric Z-spectra by acquiring images at different saturation frequencies effective to provide a substantially symmetric Z-spectrum at all pixel or voxel locations of the map.

13. The processor as set forth in claim 12, wherein the map generation operation (ii) includes, for each pixel or voxel location, interpolating or fitting the Z-spectrum to enhance frequency resolution.

14. The processor as set forth in claim 12, wherein the map generation operation (ii) includes performing a symmetry analysis on the substantially symmetric Z-spectra to generate the map of absolute frequency reference values.

15. The processor as set forth in claim 11, further configured to (iii) cause the magnetic resonance scanner to acquire a spatial map of asymmetric Z-spectra including CEST-related features using sufficiently high saturation power and sufficiently long duration selected such that the asymmetric Z-spectra exhibit the CEST-related feature, and (iv) correct the CEST-related feature in the asymmetric Z-spectra by removing spectral components that are symmetric about the water center frequency reference values identified by the map of absolute frequency reference values.

16. The processor as set forth in claim 15, further configured to (v) cause a display to display a frequency-corrected CEST map derived from the corrected CEST-related features of the asymmetric Z-spectra.

17. The processor as set forth in claim 11, further configured to (iii) cause the magnetic resonance scanner to acquire a spatial map of magnetic resonance spectra, and (iv) correct the spatial map of magnetic resonance spectra for spatially varying frequency shifts using the map of absolute frequency reference values.

18. The processor as set forth in claim 11, wherein the map of absolute frequency reference values is a map of water center frequency values.

19. A storage medium storing instructions executable by a processor to perform a method comprising:
controlling a magnetic resonance scanner to acquire a spatial map of Z-spectra that encompass the water center frequency using saturation power and duration selected such that the Z-spectra are not obscured by magnetization transfer and are dominated by direct water saturation effects so that the Z-spectra are substantially symmetric; and
performing a symmetry analysis on the substantially symmetric Z-spectra to generate a spatial map of the water center frequency.

20. A system comprising:
a magnetic resonance scanner;
a non-transitory storage medium as set forth in claim 19; and
a processor configured to execute the instructions stored on the non-transitory storage medium.

\* \* \* \* \*